(12) United States Patent
Xiao et al.

(10) Patent No.: US 7,977,245 B2
(45) Date of Patent: Jul. 12, 2011

(54) METHODS FOR ETCHING A DIELECTRIC BARRIER LAYER WITH HIGH SELECTIVITY

(75) Inventors: Ying Xiao, San Jose, CA (US); Gerardo A. Delgadino, Santa Clara, CA (US); Karsten Schneider, Dresden (DE)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 11/388,246

(22) Filed: Mar. 22, 2006

(65) Prior Publication Data

US 2007/0224807 A1    Sep. 27, 2007

(51) Int. Cl.
*H01L 21/302* (2006.01)
*H01L 21/461* (2006.01)

(52) U.S. Cl. ............... 438/710; 438/698; 257/E21.252; 257/E21.256

(58) Field of Classification Search .................. 438/689, 438/710; 257/E21.256, E21.252
See application file for complete search history.

(56) References Cited

U.S. PATENT DOCUMENTS

| | | | |
|---|---|---|---|
| 5,950,126 A | 9/1999 | Palviainen et al. | |
| 6,137,126 A | 10/2000 | Avanzino et al. | |
| 6,140,226 A | 10/2000 | Grill et al. | |
| 6,147,009 A | 11/2000 | Grill et al. | |
| 6,406,978 B1 | 6/2002 | Yang et al. | |
| 6,713,402 B2 | 3/2004 | Smith et al. | |
| 6,743,725 B1 | 6/2004 | Hu et al. | |
| 6,764,958 B1 | 7/2004 | Sugiarto et al. | |
| 6,790,755 B2 | 9/2004 | Jeon | |
| 2002/0102856 A1 | 8/2002 | Xia et al. | |
| 2002/0187627 A1 | 12/2002 | Yuang | |
| 2003/0068881 A1 | 4/2003 | Xia et al. | |
| 2003/0111181 A1 | 6/2003 | Wang et al. | |
| 2003/0199170 A1 | 10/2003 | Li | |
| 2003/0228768 A1 | 12/2003 | Chae et al. | |
| 2004/0157453 A1 | 8/2004 | Delgadino et al. | |
| 2004/0157486 A1 | 8/2004 | Brown | |
| 2004/0180556 A1 | 9/2004 | Chiang et al. | |
| 2004/0191977 A1 | 9/2004 | Li et al. | |
| 2004/0192051 A1* | 9/2004 | Tanaka et al. | 438/697 |
| 2004/0206725 A1 | 10/2004 | Fuse et al. | |
| 2004/0241928 A1* | 12/2004 | Maruyama et al. | 438/202 |
| 2005/0029229 A1 | 2/2005 | Chae et al. | |
| 2005/0059234 A1 | 3/2005 | Bera et al. | |
| 2005/0233572 A1 | 10/2005 | Su et al. | |
| 2005/0266691 A1 | 12/2005 | Gu et al. | |
| 2006/0252269 A1* | 11/2006 | Panda et al. | 438/706 |

OTHER PUBLICATIONS

PCT International Search Report and Written Opinion dated Jan. 23, 2008 for International Application No. PCT/US2007/64141.
The First Office Action issued Sep. 4, 2009 in Chinese Patent Application No. 200780010190.3.
Hayashi, et al., "High Selective Etching of $Si_3N_4$ to SiOC by Precise Ion Energy Control for sub-90 nm Dual Damascene Formation", AVS $51^{st}$ International Symposium, Nov. 15, 2004.

* cited by examiner

*Primary Examiner* — Matthew C Landau
*Assistant Examiner* — Sonya D McCall Shepard
(74) *Attorney, Agent, or Firm* — Patterson & Sheridan, L.L.P.

(57) ABSTRACT

Methods for etching a dielectric barrier layer with high selectivity to a dielectric bulk insulating layer are provided. In one embodiment, the method includes providing a substrate having a portion of a dielectric barrier layer exposed through a dielectric bulk insulating layer in a reactor, flowing a gas mixture containing $H_2$ gas, fluorine containing gas, at least an insert gas into the reactor, and etching the exposed portion of the dielectric barrier layer selectively to the dielectric bulk insulating layer.

22 Claims, 4 Drawing Sheets

(PRIOR ART)

METHODS FOR ETCHING A DIELECTRIC BARRIER LAYER WITH HIGH SELECTIVITY

BACKGROUND OF THE INVENTION

1. Field of the Invention

The present invention generally relates to semiconductor processing technologies and, more specifically, to a method for etching a dielectric barrier layer with high selectivity to a dielectric bulk insulating layer in semiconductor processing.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. sub-micron dimensions), the materials used to fabricate such components contribute to their electrical performance. For example, metal interconnects with low resistance (e.g., copper and aluminum) provide conductive paths between the components on integrated circuits.

Typically, the metal interconnects are electrically isolated from each other by a dielectric bulk insulating material. When the distance between adjacent metal interconnects and/or the thickness of the dielectric bulk insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit.

In order to minimize capacitive coupling between adjacent metal interconnects, low dielectric constant bulk insulating materials (e.g., dielectric constants less than about 4.0) are needed. Examples of low dielectric constant bulk insulating materials include silicon dioxide ($SiO_2$), silicate glass, fluorosilicate glass (FSG), and carbon doped silicon oxide (SiOC), among others.

In addition, a dielectric barrier layer often separates the metal interconnects from the dielectric bulk insulating materials. The dielectric barrier layer minimizes the diffusion of the metal into the dielectric bulk insulating material. Diffusion of the metal into the dielectric bulk insulating material is undesirable because such diffusion can affect the electrical performance of the integrated circuit, or render it inoperative. The dielectric layer needs to have a low dielectric constant in order to maintain the low-k characteristic of the dielectric stack between conductive lines. The dielectric barrier layer also acts as an etch-stop layer for a dielectric bulk insulating layer etching process, so that the underlying metal will not be exposed to the etching environment. The dielectric barrier layer has a dielectric constant of about 5.5 or less. Examples of dielectric barrier layer are silicon carbide (SiC) and nitrogen containing silicon carbide (SiCN), among others.

Some integrated circuit components include multilevel interconnect structures (e.g., dual damascene structures). Multilevel interconnect structures can have two or more bulk insulating layers, low dielectric barrier layers, and metal layers stacked on top of one another. As an exemplary dual damascene structure shown in FIG. 1A, a dielectric bulk insulating layer 108 with an underlying dielectric barrier layer 106 are stacked on another previously formed interconnect with a conductive layer 104 embedded in another dielectric bulk insulating layer 102. As a via/trench etching process is completed and a via/trench 110 is defined on the dielectric bulk insulating layer 108, the exposed dielectric barrier layer 106 defined by the via/trench 110 is subsequently removed to expose the underlying conductive layer 104 so that the following deposited conductive layer 116 can be connected and jointed therethrough, as shown in FIG. 1B. However, the similarity of the selected materials of the bulk insulating layer 108 and dielectric barrier layer 106 results in similar etch properties therebetween, thereby causing poor selectivity during etching. As shown in FIG. 1C, as the dielectric barrier layer 106 is etched, the dielectric bulk insulating layer 108 may be attacked simultaneously by the reactive etchant species, resulting in non-uniformity or tapered profile on the top and/or sidewall of the layer 114. In embodiments where the underlying conductive layer 104 is not aligned with the trench opening 110, as shown in FIG. 1D, the underlying dielectric bulk insulating layer 102 may be attacked 112 during etching of the dielectric barrier layer 106 due to poor selectivity to the dielectric bulk insulating layer 102.

Therefore, there is a need for a method of etching a dielectric barrier layer with high selectivity to a dielectric bulk insulating layer.

SUMMARY OF THE INVENTION

Methods for etching a dielectric barrier layer with high selectivity to a dielectric bulk insulating layer are provided in the present invention. In one embodiment, a method for etching a dielectric barrier layer includes providing a substrate having a portion of a dielectric barrier layer exposed through a dielectric bulk insulating layer in a reactor, flowing a gas mixture containing $H_2$ gas into the reactor, and etching the exposed portion of the dielectric barrier layer selectively to the dielectric bulk insulating layer.

In another embodiment, a method for etching a dielectric barrier layer includes providing a substrate having a portion of a dielectric barrier layer exposed therethrough a dielectric bulk insulating layer in a reactor, flowing a gas mixture containing $H_2$ gas and a fluorine containing gas into the reactor, and etching the exposed portion of the dielectric barrier layer in a presence of a plasma formed from the gas mixture.

In yet another embodiment, a method for etching a dielectric barrier layer includes providing a substrate having a portion of a dielectric barrier layer exposed through a dielectric bulk insulating layer in a reactor, wherein the dielectric barrier layer is a carbon containing silicon film, flowing a gas mixture containing $H_2$ gas, a fluorine containing gas and at least one insert gas into the reactor, and etching the exposed portion of the dielectric layer selectively to the dielectric bulk insulating layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include methods for etching a dielectric barrier layer with high selectivity to a dielectric bulk insulating layer. The methods preserve the profile and dimension of the features formed on a substrate with selectively etching the dielectric barrier layer substantially without attacking the adjacent dielectric bulk insulating layer and/or underlying conductive layer and dielectric bulk insulating layer. The high etching selectivity is achieved by using a gas mixture containing hydrogen gas ($H_2$) to etch the dielectric barrier layer.

Figure 1A:
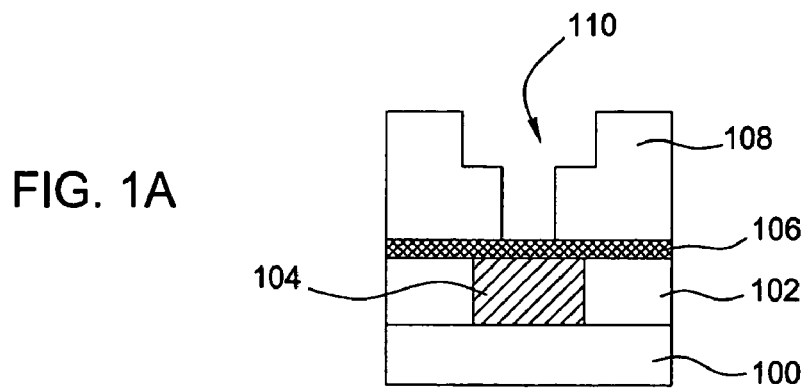
FIGS. 1A-1D are sectional views of exemplary interconnect structures.
Figure 1B:
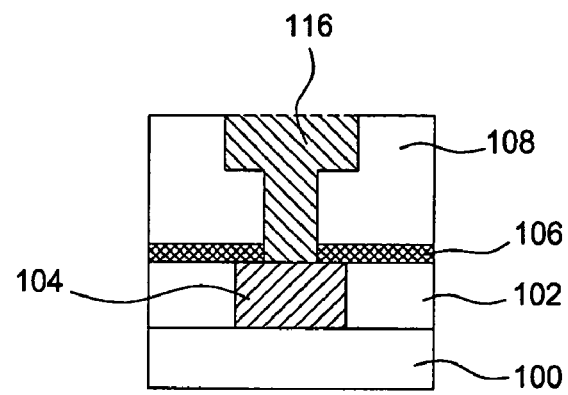
Figure 1C:
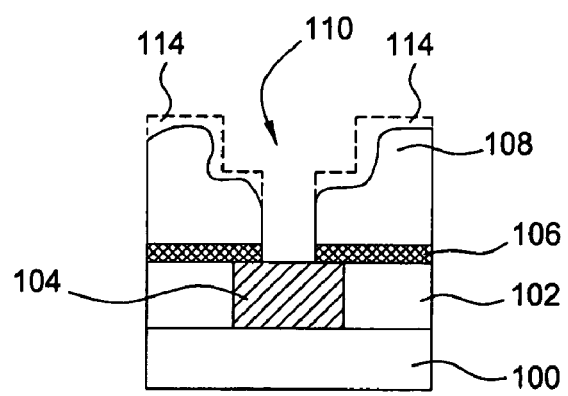
Figure 1D:
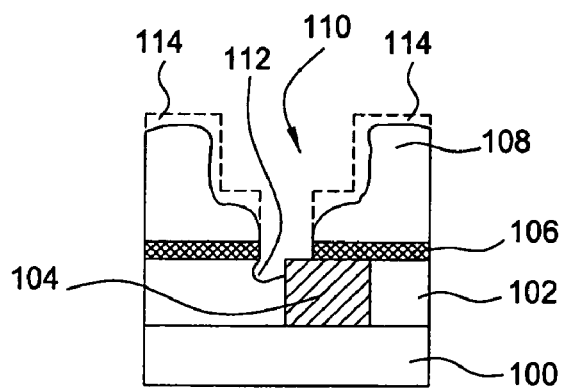
Figure 2:
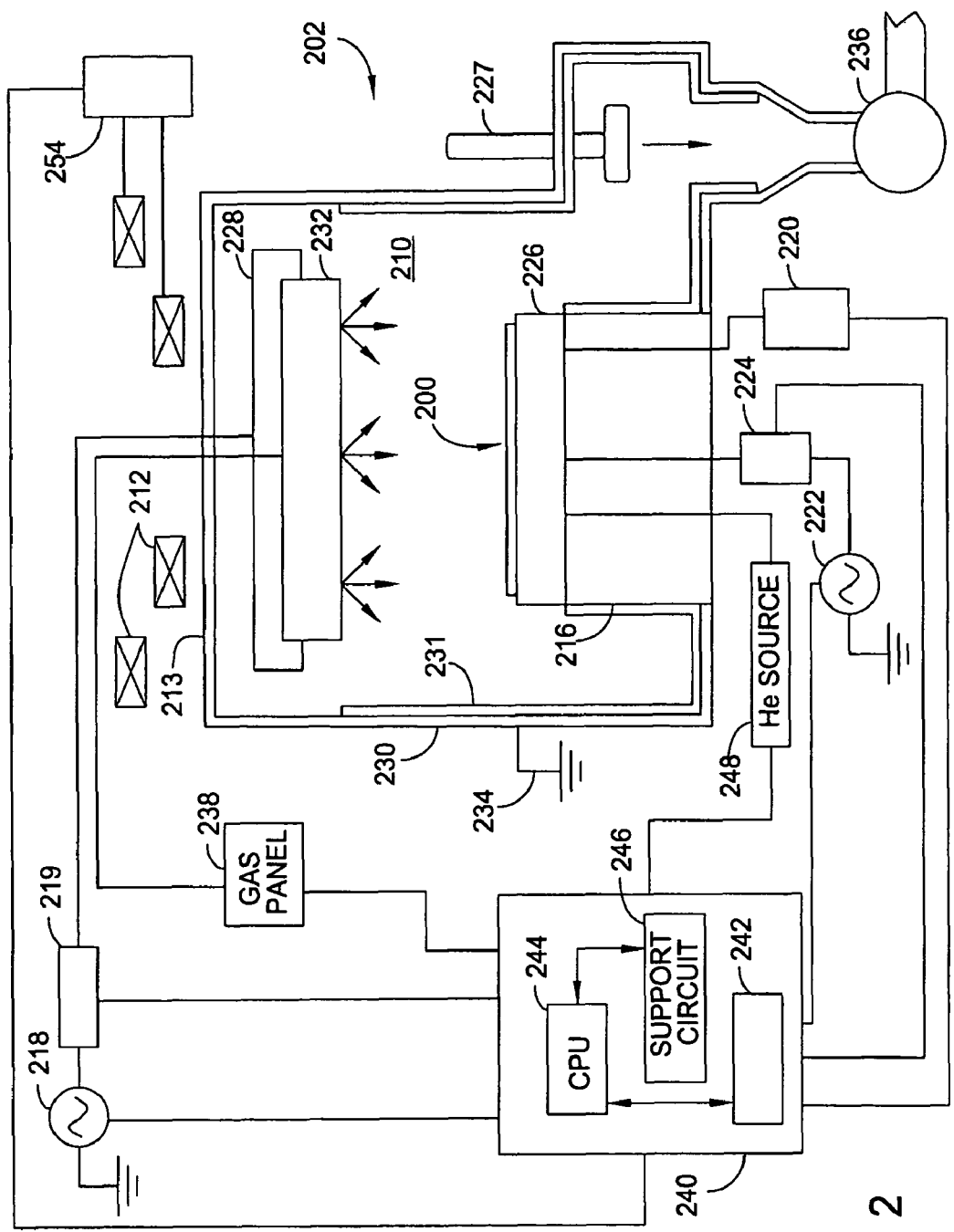
FIG. 2 is a schematic cross-sectional view of a plasma reactor used according to one embodiment of the invention.

FIG. 2 depicts a schematic, cross-sectional diagram of one embodiment of a plasma source etch reactor 202 suitable for performing the dielectric barrier layer etch according to the present invention. One such etch reactor suitable for performing the invention is the ENABLER® processing chamber, available from Applied Materials, Inc., of Santa Clara, Calif. It is contemplated that the dielectric barrier layer etching process described herein may be performed in other etch reactors, including those from other manufacturers.

In one embodiment, the reactor 202 includes a process chamber 210 having a conductive chamber wall 230. The temperature of the chamber wall 230 is controlled using liquid-containing conduits (not shown) that are located in and/or around the wall 230.

The chamber 210 is a high vacuum vessel that is coupled through a throttle valve 227 to a vacuum pump 236. The chamber wall 230 is connected to an electrical ground 234. A liner 231 is disposed in the chamber 210 to cover the interior surfaces of the walls 230. The liner 231 facilitates in-situ self-cleaning capabilities of the chamber 210, so that byproducts and residues deposited on the liner 231 can be readily removed from the liner 231.

The process chamber 210 also includes a support pedestal 216 and a showerhead 232. The support pedestal 216 is disposed below the showerhead 232 in a spaced-apart relation. The support pedestal 216 may include an electrostatic chuck 226 for retaining a substrate 200 during processing. Power to the electrostatic chuck 226 is controlled by a DC power supply 220.

The support pedestal 216 is coupled to a radio frequency (RF) bias power source 222 through a matching network 224. The bias power source 222 is generally capable of producing an RF signal having a tunable frequency of from about 50 kHz to about 60 MHz and a bias power of about 0 to 5,000 Watts. Optionally, the bias power source 222 may be a DC or pulsed DC source.

The temperature of the substrate 200 supported on the support pedestal 216 is at least partially controlled by regulating the temperature of the support pedestal 216. In one embodiment, the support pedestal 216 includes a cooling plate (not shown) having channels formed therein for flowing a coolant. In addition, a backside gas, such as helium (He) gas, provided from a gas source 248, fits provided into channels disposed between the back side of the substrate 200 and grooves (not shown) formed in the surface of the electrostatic chuck 226. The backside He gas provides efficient heat transfer between the pedestal 216 and the substrate 200. The electrostatic chuck 226 may also include a resistive heater (not shown) within the chuck body to heat the chuck 226 during processing. In one embodiment, the substrate 200 is maintained at a temperature of between about 10 to about 500 degrees Celsius.

The showerhead 232 is mounted to a lid 213 of the processing chamber 210. A gas panel 238 is fluidly coupled to a plenum (not shown) defined between the showerhead 232 and the lid 213. The showerhead 232 includes a plurality of holes to allow gases provided to the plenum from the gas panel 238 to enter the process chamber 210. The holes in the showerhead 232 may be arranged in different zones such that various gases can be released into the chamber 210 with different volumetric flow rates.

The showerhead 232 and/or an upper electrode 228 positioned proximate thereto is coupled to an RF source power 218 through an impedance transformer 219 (e.g., a quarter wavelength matching stub). The RF source power 218 is generally capable of producing an RF signal having a tunable frequency of about 160 MHz and a source power of about 0 to 5,000 Watts.

The reactor 202 may also include one or more coil segments or magnets 212 positioned exterior to the chamber wall 230, near the chamber lid 213. Power to the coil segment(s) 212 is controlled by a DC power source or a low-frequency AC power source 254.

During substrate processing, gas pressure within the interior of the chamber 210 is controlled using the gas panel 238 and the throttle valve 227. In one embodiment, the gas pressure within the interior of the chamber 210 is maintained at about 0.1 to 999 mTorr.

A controller 240, including a central processing unit (CPU) 244, a memory 242, and support circuits 246, is coupled to the various components of the reactor 202 to facilitate control of the processes of the present invention. The memory 242 can be any computer-readable medium, such as random access memory (RAM), read only memory (ROM), floppy disk, hard disk, or any other form of digital storage, local or remote to the reactor 202 or CPU 244. The support circuits 246 are coupled to the CPU 244 for supporting the CPU 244 in a conventional manner. These circuits include cache, power supplies, clock circuits, input/output circuitry and subsystems, and the like. A software routine or a series of program instructions stored in the memory 242, when executed by the CPU 244, causes the reactor 202 to perform an etch process of the present invention.

FIG. 2 only shows one exemplary configuration of various types of plasma reactors that can be used to practice the invention. For example, different types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma is maintained solely by the bias power. The plasma density can be enhanced by a magnetic field applied to the vacuum chamber using electromagnets driven with a low frequency (e.g., 0.1-0.5 Hertz) AC current source or a DC source. In other applications, the plasma may be generated in a different chamber from the one in which the substrate is located, e.g., remote plasma source, and the plasma subsequently guided into the chamber using techniques known in the art.

Figure 3:
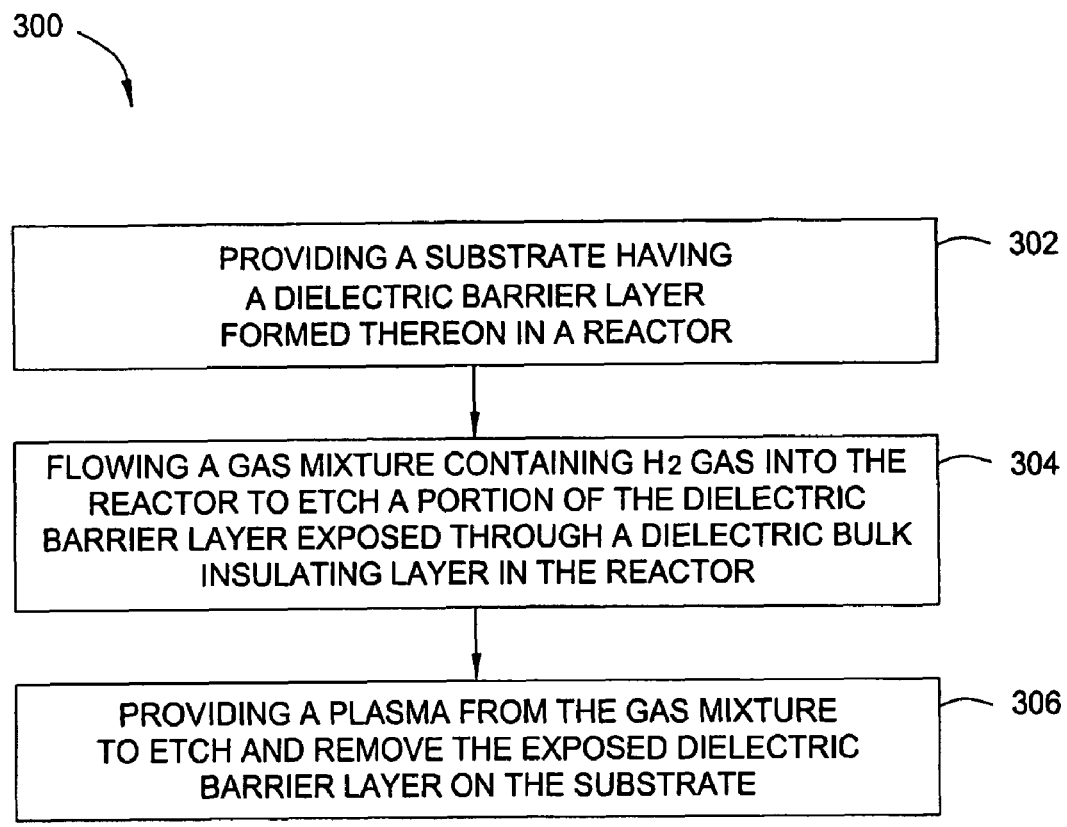
FIG. 3 is a flow diagram of one embodiment of a dielectric barrier layer removal process on an interconnect structure according to one embodiment of the invention.
Figure 4A:
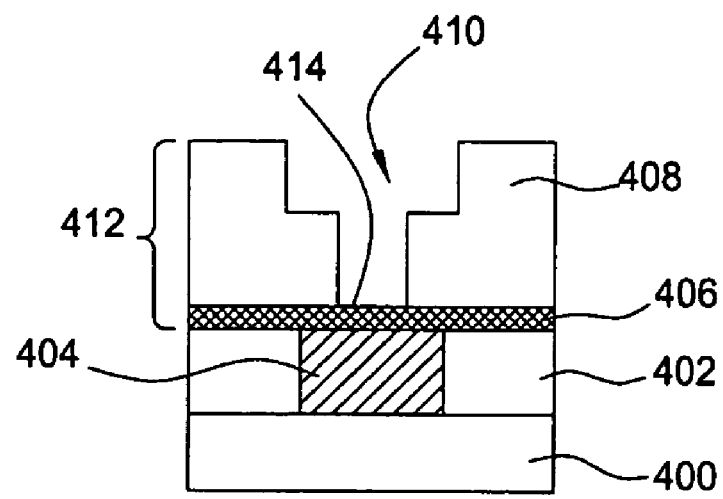
FIGS. 4A-4B are sectional views of one embodiment of an interconnect structure having an exposed dielectric barrier layer disposed on a substrate.
Figure 4B:
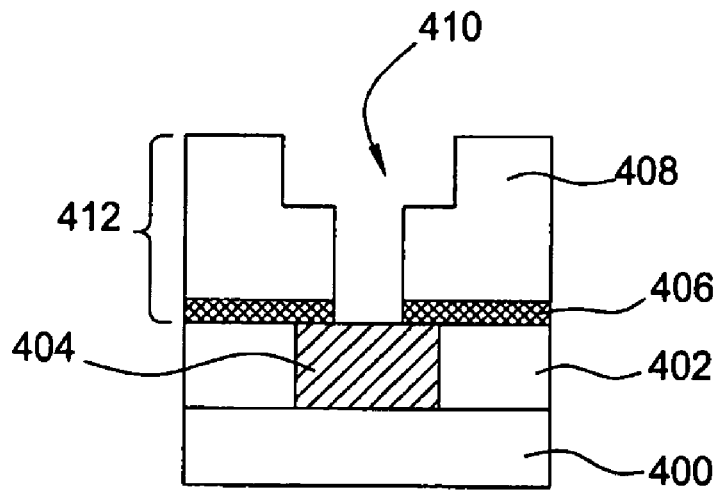

FIG. 3 illustrates a flow diagram of one embodiment of a dielectric barrier layer removal process 300 according to one embodiment of the invention. FIGS. 4A-4B are schematic cross-sectional views illustrating the sequence of the dielectric barrier layer removal process 300. The process 300 may be stored in memory 242 as instructions that executed by the controller 240 to cause the process 300 to be performed in the reactor 202.

The process 300 begins at step 302 by providing a substrate 400 having a dielectric barrier layer in an interconnect structure in the reactor 202. A dielectric stack 412, as shown in FIG. 4A, is disposed on a layer 402 having at least one conductive layer 404, such as copper line, disposed therein. The dielectric stack 412 includes a dielectric bulk insulating layer 408 over a dielectric barrier layer 406. A trench/via 410 is formed in the dielectric bulk insulating layer 408 by a conventional etching process, such as dual damascene etching process. In one embodiment, the dielectric bulk insulating layer 408 is a dielectric material having a dielectric constant less than 4.0 (low-k materials). Examples of suitable materials include carbon-containing silicon oxides (SiOC), such as BLACK DIAMOND® dielectric material available from Applied Materials, Inc., and other low-k polymers, such as polyamides.

The dielectric barrier layer 406 has a dielectric constant of about 5.5 or less. In one embodiment, the dielectric barrier layer 406 is a carbon containing silicon layer (SiC), a nitrogen doped carbon containing silicon layer (SiCN), or the like. In the embodiment depicted in FIG. 4A, the dielectric barrier layer is a SiCN film. An example of the dielectric barrier layer material is BLOK® dielectric material, available from Applied Materials, Inc.

In the embodiment depicted in FIG. 4A, the dielectric stack 410 is etched through an opening, thereby defining a feature 410, such as a trench or via, in the dielectric bulk insulating layer 408 over the dielectric barrier layer 406. A portion of the dielectric bulk insulating layer 408 is removed to expose a surface 414 of the dielectric barrier layer 406. A conductive layer 404 present in the layer 402 is below the feature 410 formed in the dielectric barrier layer 406. In one embodiment, the dielectric bulk insulating layer 408 is etched using a plasma formed from fluorine and carbon. The dielectric bulk insulating layer 408 may be etched in an etch chamber, such as the reactor 202 described in FIG. 2 or other suitable reactor.

In one embodiment, the etch process may be performed by supplying carbon and fluorine containing gas, such as carbon tetrafluoride ($CF_4$), at between about 5 to about 250 sccm, applying a power between about 50 Watt to about 2000 Watt, maintaining a temperature between about 0 degrees Celsius to about 50 Celsius, and controlling process pressure between about 5 mTorr to about 200 mTorr into the reactor. In another embodiment, at least a carrier gas, such as argon (Ar), may also be supplied accompanying with the carbon and fluorine containing gas into the reactor. The carrier gas may be supplied between about 50 to about 500 sccm.

At step 304, a gas mixture containing $H_2$ gas is supplied into the reactor 202 to etch the exposed dielectric barrier layer 406 defined by the features 410 formed in the dielectric bulk insulating layer 408. The $H_2$ gas accompanying the gas mixture promotes etching of the dielectric barrier layer 406 by generating free hydrogen radicals that react with the nitrogen and carbon components of the dielectric barrier layer 406, thereby selectively decomposing the dielectric barrier layer 406 substantially without etching the dielectric bulk insulating layer 408. In one embodiment, the gas mixture may include, but is not limited to, $H_2$ gas and a fluorine containing gas. Suitable examples of fluorine containing gas may include, but not limited to, $CH_2F_2$, $CHF_3$, $CH_3F$, $C_2F_6$, $CF_4$, $C_3F_8$, $C_4F_6$, $C_4F_8$, and the like. In another embodiment, the gas mixture may include $H_2$ gas, a fluorine containing gas and at least one insert gas. The insert gas may be selected from a group consisting of argon gas (Ar), helium gas (He), nitric oxide (NO), carbon monoxide (CO), nitrous oxide ($N_2O$), oxygen gas ($O_2$), nitrogen gas ($N_2$) and the like. In embodiments preventing the underlying conductive layer 404 from oxidizing during the etching process, the gas mixture does not include any gases containing oxygen.

Several process parameters are regulated at step 304 while the gas mixture is supplied into the etch reactor. In one embodiment, a pressure of the gas mixture in the etch reactor is regulated between about 10 mTorr to about 200 mTorr, for example, between about 20 mTorr to about 60 mTorr. and the substrate temperature is maintained between about 0 degrees Celsius and about 50 degrees Celsius, for example, between about 0 degrees Celsius and about 25 degrees Celsius.

At step 306, a plasma is formed from the gas mixture to etch the exposed dielectric barrier layer 406 and remove the dielectric barrier layer 406 from above the conductive layer 402 defined by the trench 410 in the dielectric bulk insulating layer 408 on the substrate, as shown in FIG. 4B. In one embodiment, RF source power may be applied at a power of about 100 Watts to about 800 Watts to provide a plasma from the gas mixture. The $H_2$ gas may be provided at a flow rate between about 5 sccm to about 100 sccm, for example, about between about 20 sccm to about 60 sccm. The fluorine containing gas, such as $CH_2F_2$, may be provided at a flow rate at a rate between about 0 sccm to about 80 sccm, for example, between about 10 sccm to about 30 sccm. The insert gas, such as Ar or $O_2$ gas, may be provided at a flow rate between about 50 sccm to about 500 sccm, for example about 100 sccm to about 200 sccm. The etching time may be processed at between about 10 seconds to about 80 seconds.

The etching process with the $H_2$ gas containing gas mixture enables the dielectric barrier layer 406 to be selectively etched in a manner without attacking the adjacent and/or underlying dielectric bulk insulating layer 408. The etching gas mixture of etching dielectric barrier layer 406 creates a high selectivity to dielectric bulk insulating layer 408 by generating hydrogen free radicals that mostly react with the nitrogen and carbon bonds contained in the dielectric barrier layer 406, thereby allowing the exposed dielectric barrier layer 406 defined by the trenches 410 to be uniformly etched. In one embodiment, the selectivity of the dielectric barrier layer 406 to bulk insulating layer 408 is at least 5, for example, 15.

The process of etching the dielectric barrier layer 406 is terminated after reaching an endpoint signaling that the underlying conductive layer 404 has been exposed. The endpoint may be determined by any suitable method. For example, the endpoint may be determined by monitoring optical emissions, expiration of a predefined time period or by another indicator for determining that the dielectric barrier layer 406 to be etched has been sufficiently removed.

Thus, the present invention provides an improved method for etching a dielectric barrier layer with high selectivity to a dielectric bulk insulating layer. The method advantageously facilitates the profile and dimension of the features in an interconnect structure by selectively etching the dielectric barrier layer defined by the trenches in dielectric bulk insulating layer.

While the foregoing is directed to embodiments of the present invention, other and further embodiments of the invention may be devised without departing from the basic scope thereof, and the scope thereof is determined by the claims that follow.

What is claimed is:

1. A method for etching a dielectric barrier layer in an interconnect structure, comprising:
   providing a substrate having a portion of a dielectric barrier layer exposed through a dielectric bulk insulating layer in an etch reactor, wherein the dielectric barrier layer is a nitrogen doped carbon containing silicon film (SiCN);
   flowing a gas mixture containing at least $H_2$ gas into the etch reactor; and
   etching the exposed portion of the SiCN dielectric barrier layer selectively to the dielectric bulk insulating layer in the presence of a plasma formed from the gas mixture.

2. The method of claim 1, wherein the flowing the gas mixture further comprises:
   flowing a fluorine containing gas accompanying with the $H_2$ gas into the etch reactor.

3. The method of claim 1, wherein the flowing the gas mixture further comprises:
   flowing at least one insert gas into the etch reactor.

4. The method of claim 1, wherein the flowing the gas mixture further comprises:
   flowing the $H_2$ at a flow rate between at 5 sccm to about 100 sccm.

5. The method of claim 1, wherein the etching further comprises:
   maintaining a process pressure at between about 10 mTorr to about 200 mTorr;
   controlling substrate temperature between about 0 degrees Celsius to about 50 degrees Celsius; and
   applying a plasma power between about 100 Watts to about 800 Watts.

6. The method of claim 1, wherein the SiCN dielectric barrier layer has a dielectric constant less than 5.5, and the dielectric bulk insulating layer has a dielectric constant less then 4.

7. The method of claim 1, wherein the dielectric bulk layer is a carbon containing silicon oxide film.

8. The method of claim 1, further comprising:
   removing the exposed SiCN dielectric barrier layer; and
   exposing an underlying conductive layer disposed below the SiCN dielectric barrier layer on the substrate.

9. The method of claim 2, wherein the flowing a fluorine containing gas further comprises:
   flowing the fluorine containing gas at a flow rate between at about 0 sccm to about 80 sccm.

10. The method of claim 2, wherein the fluorine containing gas is selected from a group consisting of $CH_2F_2$, $CHF_3$, $CH_3F$, $C_2F_6$, $CF_4$ and $C_3F_8$.

11. The method of claim 3, wherein the flowing an insert gas further comprises:
    flowing the insert gas at a rate between at 50 sccm to about 500 sccm.

12. The method of claim 3, wherein the insert gas is selected from a group consisting of Ar, $O_2$, CO, NO, $N_2O$, He and $N_2$.

13. A method for etching a dielectric barrier layer in an interconnect structure, comprising:
    providing a substrate having a portion of a dielectric barrier layer exposed through a dielectric bulk insulating layer in an etch reactor, wherein the dielectric barrier layer is a nitrogen doped carbon containing silicon film (SiCN);
    flowing a gas mixture containing $H_2$ gas and a fluorine containing gas into the etch reactor; and
    etching the exposed portion of the SiCN dielectric barrier layer selectively to the dielectric bulk insulating layer in a presence of a plasma formed from the gas mixture.

14. The method of claim 13, wherein the flowing the gas mixture further comprises:
    flowing the hydrogen gas ($H_2$) at a flow rate between at about 5 sccm to about 100 sccm; and
    flowing fluorine containing gas at a flow rate between at about 0 sccm to about 80 sccm.

15. The method of claim 13, wherein the flowing the gas mixture further comprises:
    flowing at least one insert gas into the etch reactor, wherein the insert gas is flowed at a flow rate between at about 50 sccm to about 500 sccm.

16. The method of claim 13, wherein the fluorine containing gas is selected from a group consisting of $CH_2F_2$, $CHF_3$, $CH_3F$, $C_2F_6$, $CF_4$ and $C_3F_8$.

17. The method of claim 13, wherein the flowing a gas mixture further comprises:
    maintaining a process pressure at between about 10 mTorr to about 200 mTorr;
    controlling substrate temperature between about 0 degree Celsius to about 50 degree Celsius; and
    applying a plasma at between about 100 Watts to about 800 Watts.

18. The method of claim 13, wherein the SiCN dielectric barrier layer has a dielectric constant less than 5.5.

19. The method of claim 15, wherein the insert gas is selected from a group consisting of Ar, $O_2$, CO, NO, $N_2O$, He and $N_2$.

20. A method for etching a dielectric barrier layer in an interconnect structure, comprising:
    providing a substrate having a portion of a dielectric barrier layer exposed through a dielectric bulk insulating layer in an etch reactor, wherein the dielectric barrier layer is a nitrogen doped carbon containing silicon film (SiCN) and the dielectric bulk insulating layer is a carbon containing silicon oxide film;
    controlling the substrate temperature between about 0 degrees Celsius to about 50 degrees Celsius;
    flowing a gas mixture containing $H_2$ gas, a fluorine containing gas and at least one insert gas into the etch reactor; and
    etching the exposed portion of the dielectric barrier layer selectively to the dielectric bulk insulating layer in the presence of a plasma formed from the gas mixture.

21. The method of claim 20, wherein the flowing a gas mixture further comprises:
    flowing the $H_2$ gas at a flow rate between about 5 sccm to about 100 sccm;
    flowing the fluorine containing gas at a rate between about 0 sccm to about 80 sccm, wherein the fluorine containing gas is selected from a group consisting of $CH_2F_2$, $CHF_3$, $CH_3F$, $C_2F_6$, $CF_4$ and $C_3F_8$; and
    flowing the insert gas at a flow rate between about 50 sccm to 500 sccm, wherein the insert gas is selected from a group consisting Ar, $O_2$, CO, NO, $N_2O$, He and $N_2$.

22. The method of claim 20, wherein the flowing the gas mixture further comprises:
    maintaining a process pressure at between about 10 mTorr to about 200 mTorr;
    and
    applying a plasma at between about 100 Watts to about 800 Watts.

* * * * *